United States Patent [19]
Chung et al.

[11] Patent Number: 5,208,609
[45] Date of Patent: May 4, 1993

[54] ROLLER TYPE DEVELOPING APPARATUS FOR A CYCOLOR TYPE COLOR VIDEO PRINTER

[75] Inventors: Seok Pyo Chung; Seong Ju Lee; Hyun Ki Park, all of Seoul, Rep. of Korea

[73] Assignee: Goldstar Co., Ltd., Seoul, Rep. of Korea

[21] Appl. No.: 729,944

[22] Filed: Jul. 15, 1991

[30] Foreign Application Priority Data

Jul. 16, 1990 [KR] Rep. of Korea ............... 10747/1990
Aug. 31, 1990 [KR] Rep. of Korea ............... 13824/1990
Dec. 13, 1990 [KR] Rep. of Korea ............... 20499/1990

[51] Int. Cl.$^5$ ............................................. H04N 1/21
[52] U.S. Cl. ............................................. 346/110 R
[58] Field of Search .............. 346/108, 110 R; 355/27, 355/106

[56] References Cited

U.S. PATENT DOCUMENTS

4,819,032  4/1989  Nagumo ................................. 355/27
4,827,312  5/1989  Ogiwara et al. ...................... 355/27

*Primary Examiner*—Mark J. Reinhart
*Attorney, Agent, or Firm*—David E. Lovejoy

[57] ABSTRACT

A roller type developing apparatus for a cycolor type color video printer. A pair of said plates are mounted on a base of the color video printer and spaced apart from each other, the side plates each is provided with a vertical mounting hole. The upper and lower pressing rollers each is rotatably supported between the side plates, and provided with a clearance for allowing the cylith film and the receiver paper to pass therethrough at the same time. The upper and lower support bearings are vertically mounted in each mounting hole of the side plate and connected to respective end shafts of the upper and lower pressing rollers, respectively, and each is adapted for supporting the upper and lower pressing rollers. The pressure controlling member is adapted for controlling the clearance in order to control the pressure for the upper and lower pressing rollers. The present invention provides a roller type developing apparatus which is provided with the clearance, thereby preventing the deflection of the pressing rollers and the jamming the cycolor paper, and providing the equality of the coloring and the compactness of the color video printer.

15 Claims, 8 Drawing Sheets

ROLLER TYPE DEVELOPING APPARATUS FOR A CYCOLOR TYPE COLOR VIDEO PRINTER

BACKGROUND OF THE INVENTION

The present invention relates to cycolor type color video printers for printing a color image by using a cycolor paper comprising a cylith film and a receiver paper, and more particularly to a roller type developing apparatus for said cycolor type color video printers.

Conventionally, a cycolor type color video printer is known as a system for printing a color image on a receiver paper by using a cylith film, which cylith film is applied with a great amount of cylith capsules thereon.

Figure 1:
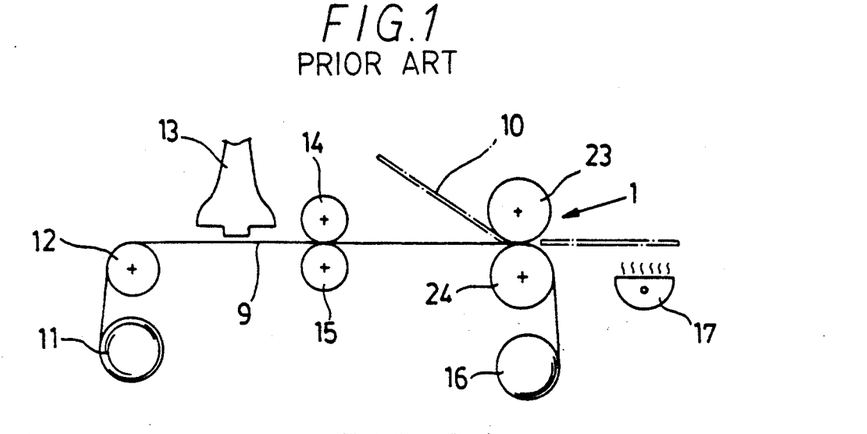
FIG. 1 is a schematic view of a conventional cycolor type color video printer including a roller type developing apparatus.

Referring to FIG. 1, a general cycolor type color video print (hereinafter, referred to simply as "a video printer") comprises a supply reel 11 for supplying the cylith film 9, a guide roller 12 for guiding the movement of said cylith film 9, a fiber optics cathode ray tube 13 (hereinafter, referred to simply as "a F/O CRT"), a capstan roller 14 and a pinch roller 15 each for guiding the cylith film 9, the developing apparatus 1 including upper and lower pressing rollers 23 and 24 and adapted for developing the color image on the receiver paper 10 by using said cylith film 9, a take-up reel 16 for taking up said cylith film 9 after the developing process is carried out by the developing apparatus, and a heater 17 for heating the receiver paper 10 having been transcribed with the color image so as to fix said color image. Therefore, the video printer carries out its printing operation by transcribing the color image from the cylith film 9 onto the receiver paper 10 by the developing apparatus 1 and fixing said transcribed color image, that is the developed color image on said receiver paper 10, by the heater 17.

Figure 2A:
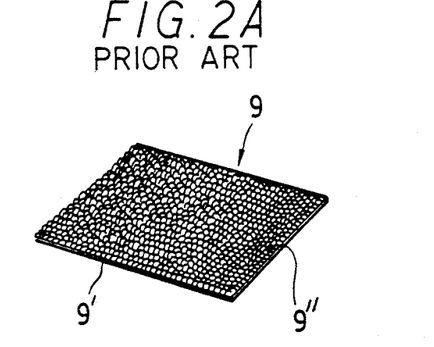
FIG. 2A is a perspective view of a cylith film for use in the video printer of FIG. 1.
Figure 2B:
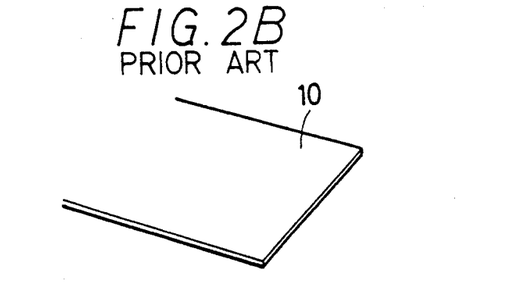
FIG. 2B is a perspective view of a receiver paper for use in video printer of FIG. 1.
Figure 2C:
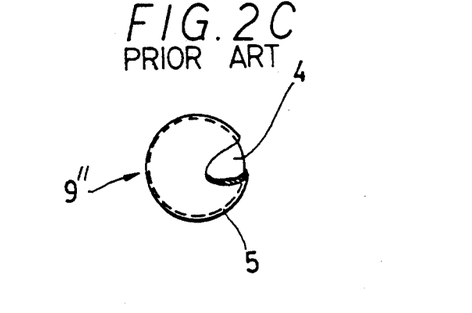
FIG. 2C is an enlarged broken perspective view of a spherical cylith capsule of the cylith film of FIG. 2A.

On the other hand, the cylith film 9 generally comprises a laminated film substrate 9' and the great amount of cylith capsules 9'' applied to said film substrate 9' as shown in FIGS. 1A and 1C, said capsules 9' photosensitive to respective R, G and B color lights. The cylith film 9 supplied from the supply reel 11 is exposed to the desired color image light by the F/O CRT 13, and then passes, together with the receiver paper 10 lying upon said exposed cylith film 9, between the upper and lower pressing rollers 23 and 24 of the developing apparatus 1. The upper and lower rollers 23 and 24 allow the cylith film 9 and the receiver paper 10 to pass therethrough with an optimal pressure so that the cylith capsules 9'' are broken by means of the pressure, thereby transcribing the exposed color image of said cylith film 9 onto said receiver paper 10.

Generally, the cylith film 9 together with the receiver paper 10 are known as "a cycolor paper", and the transcribing process in which each cylith capsule 9'' is broken by means of the pressure provided by the developing apparatus in order to transcribed the color image onto the receiver paper 10 is known as "developing process".

As shown in FIG. 1C, each cylith capsule 9'' is formed as a fine grain comprising dyes 4 and a thermohardening photosensitive covering 5 containing said dyes 4 therein. The cylith capsule 9'' has an unusual sensibility for R, G and B color lights and a diameter ranging from about 2 μm to about 12 μm. Upon being exposed to the color light, the photosensitive covering 5 of the cylith capsule 9'' is cured in response to the intensity of said light.

The operation of the video printer for printing by using the cylith film 9 and the receiver paper 10 will be described in conjunction with FIGS. 1, 3A, 3B and 3C.

Figure 3A:
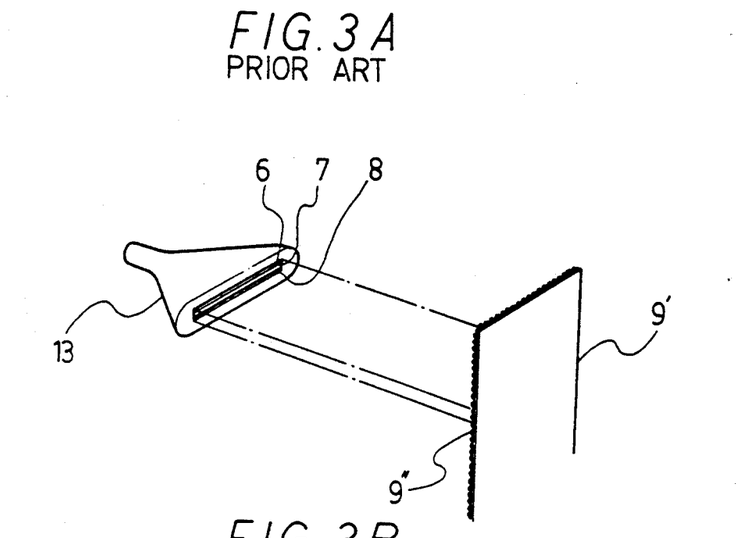
FIG. 3A is a perspective view representing an exposing operation for the cylith film carried out by the F/O CRT.

As shown in FIG. 3A which represents the exposing process for the cylith film 9, the cylith film 9 supplied from the supply reel 11 is exposed to the color light of the F/O CRT 13 provided with R, G and B fluorescent sources 6, 7 and 8 so that the photosensitive coverings 5 of respective cylith capsules 9'' are cured in response to the R, G and B color lights.

Figure 3B:
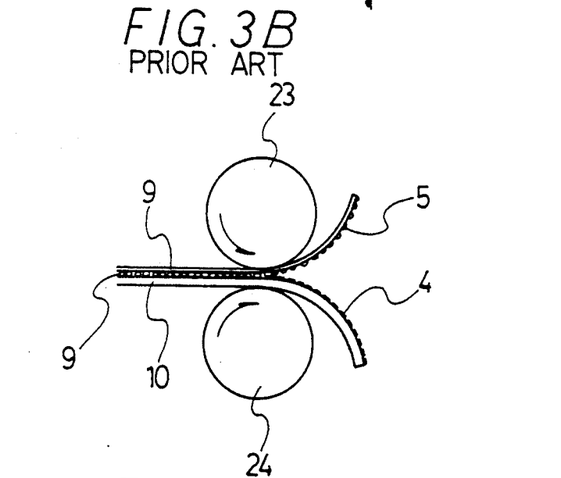
FIG. 3B is a perspective view representing a developing operation of the color image carried out by the developing apparatus.

The cyclith film 9 together with the receiver paper 10 then pass at an optimal pressure between the upper and lower pressing rollers 23 and 24 of the developing apparatus 1, as shown in FIG. 3B showing the developing process. At this time, the exposed photosensitive covering 5 of each cylith capsule 9'' is broken so that the desired color image of the cylith film 9 is transcribed onto the receiver paper 10 by the transcription of the dyes 4 of said capsule 9'' onto the receiver paper 10.

Figure 3C:
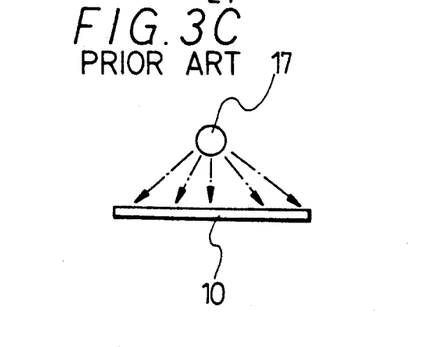
FIG. 3C is a front view representing a fixing operation the developed color image carried out by the heater.

Thereafter, the cylith film 9 is took up by the take-up reel 16, while the receiver paper 10 having the color image thereon is heated by the heater 17 in order to fix said color image thereon.

Figure 4A:
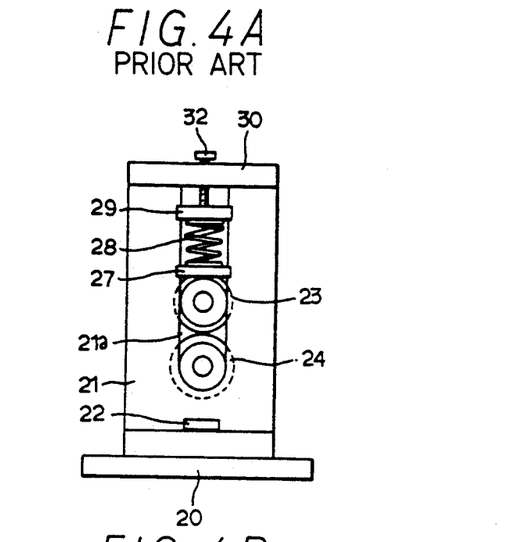
FIGS. 4A and 4B are a side view and an elevational sectional view of a known developing apparatus, respectively.
Figure 4B:
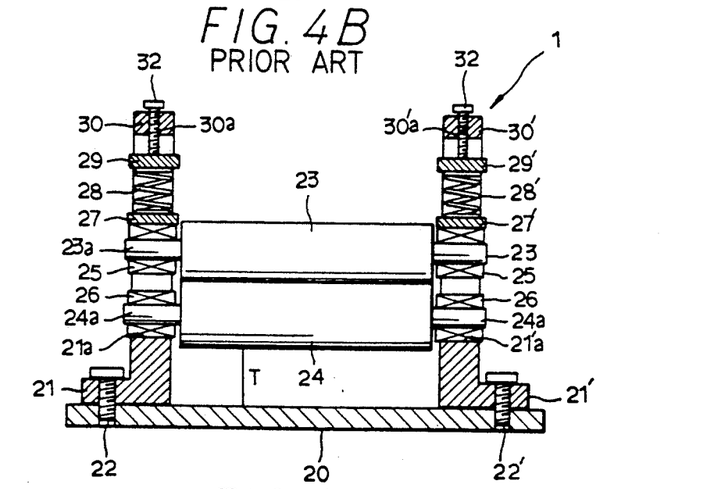

The present invention especially relates to the developing apparatus 1 of the video printer, as above mentioned. An example of the known developing apparatus 1 is shown in FIGS. 4A and 4B which are a side view and an elevational sectional view of said known developing apparatus 1, respectively.

As shown in the drawings, the known developing apparatus 1 comprises a pair of said plates 21 and 21' mounted on the printer base 20 by means of setting screws 22 and 22' and spaced apart from each other, and a pair of pressing rollers 23 and 24 each rotatably disposed between the side plates 21 and 21'. The side plates 21 and 21' each is provided with a vertical mounting hole 21a, 21'a provided for receiving a pair of bearings 25 and 26 of the upper and lower pressing rollers 23 and 24, said bearings 25 and 26 located in order to contact with each other. Each of the upper and lower pressing rollers 23, 24 includes a pair of supporting shafts 23a, 23b integrally formed at both ends thereof and each having a smaller diameter than that of the pressing roller, said supporting shafts 23a and 24a each fixed to each bearing 25, 26. Each of said plates 21, 21' also includes lower and upper pressing plates 27 and 29, 27' and 29, and compression coil springs 28, 28' interposed between said upper and lower plates 27 and 29, 27' and 29, said lower pressing plate 27, 27' contacted to the upper bearing 25 of the upper pressing roller 23 at its under surface. An upper plate 30, 30' is fixed to each side plate 21, 21' and provided with an inner threaded hole 30a, 30'a at the center portion thereof, each said inner threaded hole 30a, 30'a receiving a pressure controlling bolt 32, 32'. Each of the pressure controlling bolt 32, 32' is contacted to the upper surface of the pressing plates 29, 29' at its lowermost end. Thus, each of the pressure controlling bolt 32, 32' biases said upper pressing plates 29, 29' downwards by being tightened as demanded.

Therefore upon tightening the pressure controlling bolts 32, 32', said bolts 32, 32' move downwards simultaneously with biasing the upper pressing plates 29, 29' downwards, thereby causing the compression coil springs 28, 28' to be compressed and the pressing power of the pressure controlling bolts 32, 32' to be transmitted to the upper support bearing 25 of the upper pressing roller 23. Thus, a desired pressure is provided for the upper and lower pressing rollers 23 and 24 so that the pressure necessary for the developing process of said developing apparatus can be controlled.

However, the known developing apparatus 1 has several disadvantages in that it needs to include the lower and upper pressing plates 27, 27', 29 and 29' and compression coil springs 29 and 29' for supporting the upper and lower pressing rollers 23 and 24, so that the height of the apparatus 1 is relatively higer, thereby causing the installing work for the video printer to be relatively difficult and the size of the video printer to be complex and enlarged. Also, because the upper and lower pressing rollers 23 and 24 usually contact with each other, the known developing apparatus 1 has another disadvantages in that there may be a danger of frictional damage on each outer contacting surface of the upper and lower pressing rollers 23 and 24, and a necessity of an auxiliary device for providing as demanded a clearance between said upper and lower pressing rollers 23 and 24 and maintaining said clearance without any displacement.

Figure 5:
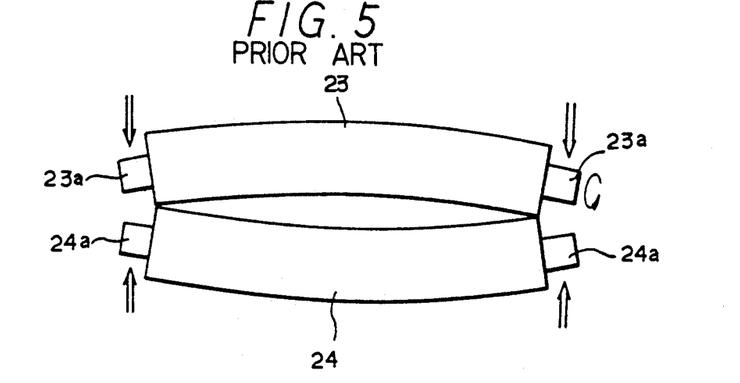
FIG. 5 is an exaggerated front view of upper and lower pressing rollers of the developing apparatus of FIGS. 4 for showing the deflection thereof.

Furthermore, the known developing apparatus has still another disadvantage in that there may be as shown in FIG. 5 a deflection in the upper and lower pressing rollers 23 and 24 as the supporting shafts 23a and 24a thereof are pressed downwardly in order to provide an optimal pressure for said upper and lower pressing rollers 23 and 24, said pressure enough for breaking the cylith capsules 9" of the cylith film 9, by means of the pressure controlling bolts 32 and 32', thereby causing the jamming of the cycolor paper P and the bad printing result such as an unequal coloring result to occur.

SUMMARY OF THE INVENTION

It is, therefore, an object of the present invention to provide a roller type developing apparatus for a cycolor type color video printer which is provided with a clearance between upper and lower pressing rollers thereof, thereby preventing each outer surface of said upper and lower pressing rollers from being damaged, and making it possible to remove an auxiliary device for providing and maintaining a clearance between said upper and lower pressing rollers, and providing the compactness of the color video printer resulting from reducing the height of said developing apparatus, and also facilitating the installing work for the video printer.

It is another object of the present invention to provide a developing apparatus for a cycolor type color video printer which prevents the deflection of the upper and lower pressing rollers thereof, thereby prevention the jamming of the cycolor paper comprising the cylith film and the receiver paper and providing the equality of the coloring.

The above-mentioned objects of the present invention can be accomplished by providing in a cycolor type color video printer including a roller type developing apparatus for transcribing an exposed color image of a cylith film onto a receiver paper by means of pressing power provided thereby, said developing apparatus comprising: a pair of said plates mounted on a base of said color video printer and spaced apart from each other, said side plates each provided with a mounting hole; rotary pressing means rotatably supported between said side plates, said rotary pressure means provided with a clearance for allowing said cylith film and said receiver paper to pass therethrough at the same time; upper and lower support bearings vertically mounted in each said mounting hole of said side plate and connected to respective end shafts of said rotary pressing means, respectively, and each adapted for supporting said rotary pressing means; and a pressure controlling means for controlling said clearance in order to control the pressure for said rotary pressing means.

BRIEF DECRIPTION OF THE DRAWINGS

The above and other objects, features and other advantages of the present invention will be more clearly understood from the following detailed description taken in conjunction with the accompanying drawings, in which:

FIGS. 3A and 3B represents respective operations by respective parts of the video printer of FIG. 1, respectively, in which;

FIGS. 7 and 8 are enlarged side views showing the developing operation by the developing apparatus of FIGS. 4A and 4B, respectively, in which:

DETAILED DESCRIPTION OF THE PREFERRED EMBODIMENTS

Figure 6A:
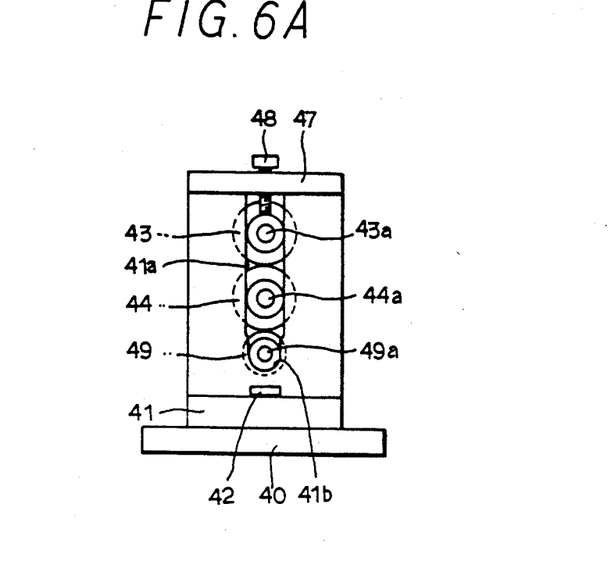
FIGS. 6A and 6B are views corresponding to FIGS. 4A and 4B, respectively, but showing the first embodiment of a developing apparatus in accordance with the present invention.
Figure 6B:
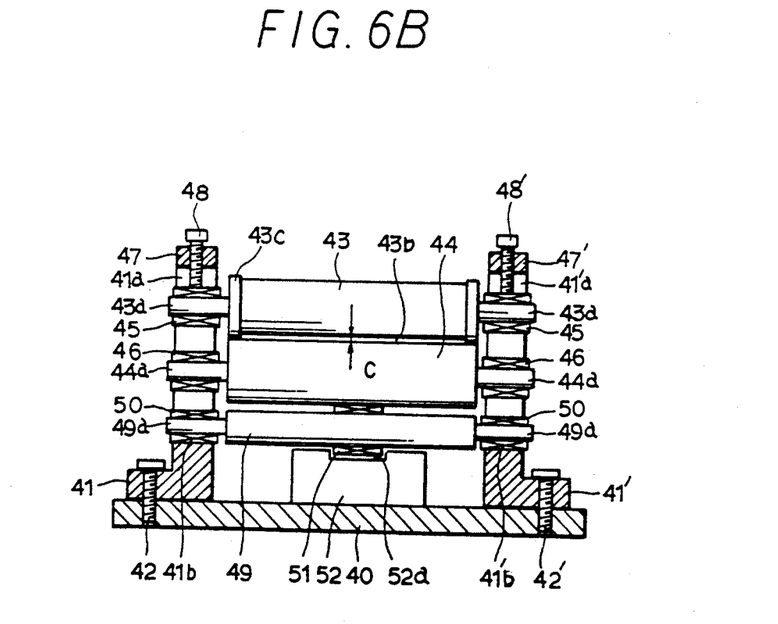

Referring now to FIGS. 6A and 6B which are a side view and an elevational sectional view of a developing apparatus for cycolor type color video printer in accordance with the present invention, the developing apparatus includes a pair of side plates 41 and 41' mounted on the printer base 40 by means of setting screws 42 and 42' and spaced apart from each other, and a pair of pressing rollers 43 and 44 each rotatably supported between the side plates 41 and 41'. The side plates 41 and 41' each is provided with a vertical mounting hole 41a, 41'a provided for receiving a pair of bearings 45 and 46 of the upper and lower pressing rollers 43 and 44, each of said bearings 45 and 46 rotatably connected to a support shaft 43a, 44a of each said pressing roller 43, 44 and tightly located in the mounting hole 41a, 41'a in order to tightly contact with each other. Each of the side plates 41, 41' is provided with a pressure controlling bolt 48, 48' which is screw type connected to each upper plate 47, 47' fixed to upper portion of each said side plate 41, 41', said pressure controlling bolts 48, 48' adapted for controlling the pressure for the upper and lower pressing rollers 43 and 44.

Each of side plates 41, 41' of this developing apparatus also includes a relatively narrow roller mounting hole 41b, 41'b extending directly downwardly from each mounting hole 41a, 41'a. There is provided an elastic slender support roller 49 as a pressure controlling member for controlling the pressure applied to the upper and lower pressing rollers 43 and 44 and preventing the deflection of said upper and lower pressing rollers 43 and 44. The support roller 49 has a pair of end bearings 50 inserted onto both end shafts 49a of said support roller 49, respectively, and is disposed between the side plates 41, 41' by seating said end bearings 50 on the respective lowermost ends of the narrow roller mounting holes 41b and 41'b so as to be spaced from the lower pressing roller 44, thereby providing a predetermined clearance between the lower pressing roller 44 and the support roller 49. The support roller 49 is provided with a support bearing 51 rotatable mounted onto a center portion thereof. Also, a guide member 52 provided with a guide groove 52a on an upper surface thereof is mounted on the printer base 40, the guide member 52 is adapted for restraining the axial displacement of the support bearing 51 by means of said guide groove 52a thereof. The upper pressing roller 43 is provided with flanges 43c, enlarged diameter portions, at both ends thereof in order to provide a depression 43b between the flanges 43c, while the lower pressing roller 44 has the cylindrical shape having an equal diameter through the whole length thereof. Each support shaft 43a integrally extends outwardly from each end of the upper pressing roller 43. The flanges 43a tightly contact with the outer surface of both ends of the lower pressing roller 44, thereby providing a clearance "C" between the upper and lower pressing rollers 43 and 44.

The operational effect of the developing apparatus will be described as follows.

Upon tightening the pressure controlling bolts 48 and 48', the bolts 48 and 48' descend in order to transmit the downward pressing power to the support roller 49 by way of the upper and lower pressing rollers 43 and 44. At this time, the support roller 49 is deflected, so that said support roller 49 is bent upwardly in order to be the predetermined bent shape. The bent support roller 49 functions as an elastic support member, capable of preventing the deflection of the upper and lower pressing rollers 43 and 44, by means of its own elasticity. In accordance, this developing apparatus can obtain an optimal pressure necessary for the developing operation by controlling the pressure controlling bolts 48 and 48'.

Thereafter, the upper pressing roller 43 rotates so that the cylith film 9 and the receiver paper 10, having received into the clearance "C" provided by the depression 43b between the upper and lower pressing rollers 43 and 44, move at the same time under a predetermined pressure provided by the pressing rollers 43 and 44 without any deflection of said upper and lower pressing rollers 43 and 44 (see FIG. 5), thereby the photosensitive covering 5 of each cylith capsule 9" of the cylith film 9 is broken by said predetermined pressure in order to transcribe the dyes 4 of the cylith capsule 9", having enclosed inside said covering 5, onto the receiver paper 10 moving together with said cylith film 9.

At this time, the support bearing 51 of the support roller 49 allows said support roller 49 to more smoothly rotate, thereby causing the upper and lower pressing rollers 43 and 44 to rotate more smoothly. Also, the guide member 52 fixed on the printer base 40 restrains the axial displacement of the support bearing 49 by means of the guide groove 52a thereof.

Figure 7:
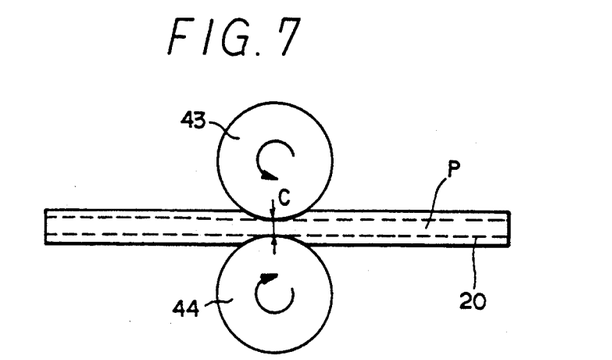
FIG. 7 shows an ideal case.
Figure 8:
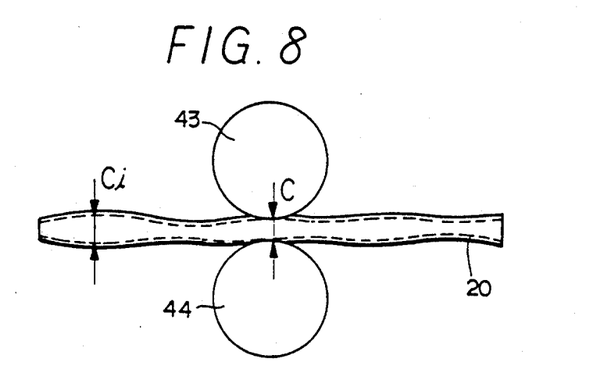
FIG. 8 shows a practical case.

FIGS. 7 and 8 each is an enlarged side view showing the developing operation by this developing apparatus for representing the setting theory of the clearance "C" between the upper and lower pressing rollers 43 and 44, in which FIG. 7 shows an ideal coloring line 20 of an ideal cycolor paper "P", said paper "P" comprising the cylith film 9 and the receiver paper 10, while FIG. 8 shows a practical coloring line 20 of a practical cycolor paper "P". The coloring line 20 means a line of the cycolor paper "P" at which the coloring by the dyes 4 of each broken cylith capsule 9" arrives. In case of the ideal cycolor paper "P" shown in FIG. 7, the thickness thereof is supposed to be equal through the whole length of said ideal cycolor paper "P" so that the clearance "C" between the upper and lower pressing rollers 43 and 44 can be easily set in consideration of the thickness of the ideal cycolor paper "P". However, the practical thickness of the cycolor paper "P" is not equal through the whole length of said cycolor paper "P" as shown in FIG. 8, so that the clearance "C" has to be set in consideration of the maximum value "Ci" of the coloring thickness of the practical cycolor paper "P" in order to provide the coloring equality, which maximum value "Ci" of the coloring thickness can be easily obtained as it is calculated during the manufacturing process for said cycolor paper "P". Thus, the value of clearance "C" between the upper and lower pressing rollers 43 and 44 is set as being less than the maximum value "Ci" of the coloring thickness of the practical cycolor paper "P", that is C≦Ci. The value of the clearance "C" is, therefore, set as being relatively larger than the thickness of the cylith film 9 (about 0.04 mm) so that each pressing roller 43, 44 does not need to be displaced in order to control the clearance "C" even when there is necessity of movement of an unexposed cylith film 9.

If the unexposed cylith film 9 passes between an upper pressing roller and a lower pressing roller, tightly contacting with each other as those of the prior art, each cylith capsule 9" of said cylith film 9 is broken by the pressure provided by said upper and lower pressing rollers in order to directly transcribe the dyes 4 of each said capsule 9" onto said upper pressing roller, resulting in contamination of said upper and lower pressing rollers and performance deterioration of the video printer.

In the initial state of receiving the receiver paper 10 by the developing apparatus, the receiver paper 10 is smoothly received and passes between the upper and lower pressing rollers 43 and 44 as the frictional force generated among said upper and lower pressing rollers 43 and 44 and the receiver paper 10 is relatively larger than the thrust between said pressing rollers 43 and 44 for thrusting the receiver paper 10.

Figure 9:
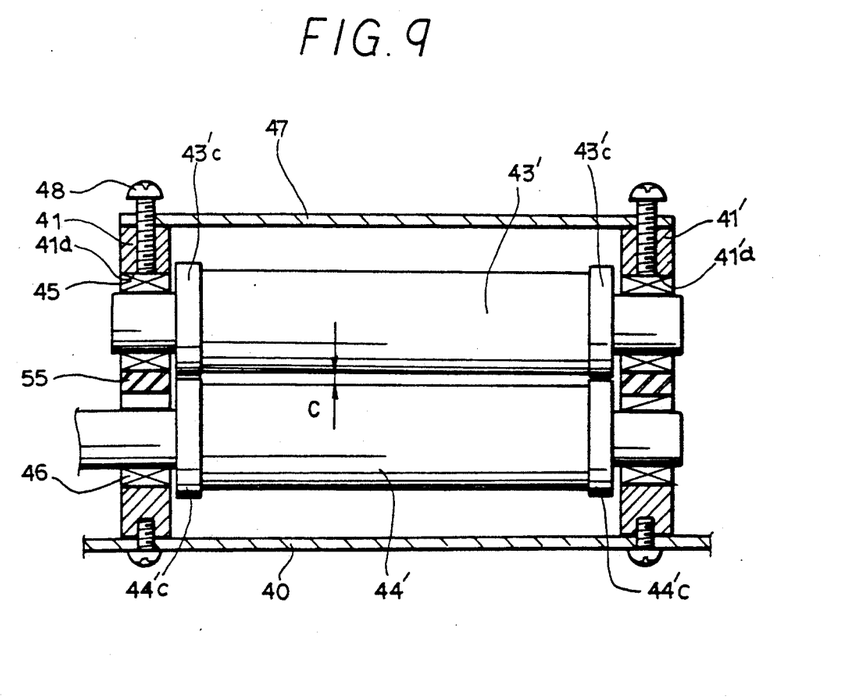
FIG. 9 is an elevational sectional view showing the second embodiment of a developing apparatus in accordance with the present invention.

On the other hand, the developing apparatus in accordance with the present invention may comprise an upper pressing roller 43' and a lower pressing roller 44', each provided with flanges 43'c, 44'c at both ends thereof as shown in FIG. 9. Therefore, this developing apparatus has the clearance "C" provided between the upper and lower pressing apparatus 43' and 44' by means of the flanges 43'c and 44'c. The flanges 43'c and 43'c contact with each other and function as a stopper for restraining the axial displacements of the upper and lower pressing rollers 43' and 44'. This second embodiment of the developing apparatus includes a pair of elastic cushions 55 as the pressure controlling member, each cushion 55 disposed between the upper and lower support bearings 45 and 46 and adapted to usually bias said upper and lower bearings 45 and 46 upwardly and downwardly.

Therefore, upon disposing the upper and lower support bearings 45 and 46 in respective mounting holes 41a and 41'a of both side plates 41 and 41' with respective cushions 55 each tightly interposed between said upper and lower support bearings 45 and 46, said upper and lower support bearings 45 and 46 are biased upwardly and downwardly by each cushion 55, thereby causing the upper and lower support bearings 45 and 46 to tightly contact with the upper and lower ends of each said mounting hole 41a, 41'a, respectively. Thus, the upper and lower pressing rollers 43' and 44' each is prevented from being displaced during the unloading state of the developing apparatus. The cushions 55 also allow the developing apparatus to have the predetermined clearance "C" between the upper and lower pressing rollers 43' and 44', simultaneously with providing a minute gas between the flanges 43'c and 44'c of the upper and lower pressing rollers 43' and 44' in order to cause the smooth rotation of said upper and lower pressing rollers 43' and 44'.

In FIG. 9, the reference numeral 48 denotes each pressure controlling bolt for controlling the elasticity of each cushion 55.

In this second embodiment of the developing apparatus, it is facilitated to assemble said developing apparatus as the predetermined clearance "C" between the upper and lower pressing rollers 43' and 44' is provided by simple disposing the upper and lower bearings 45 and 46 in the mounting holes 41a and 41'a of the side plates 41 and 41' with the cushions 55 each interposed between the upper and lower support bearings 45 and 46.

Figure 10A:
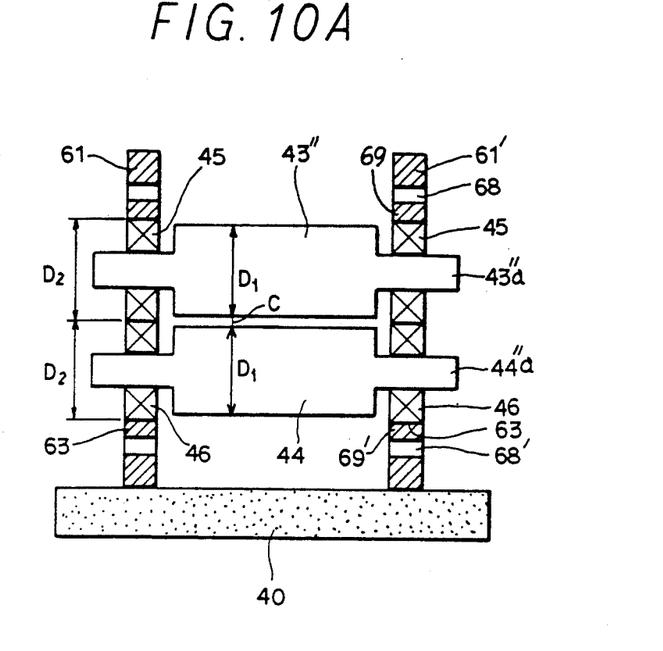
FIGS. 10A and 10B are an elevational sectional view and a side view showing the third embodiment of a developing apparatus in accordance with the present invention, respectively.
Figure 10B:
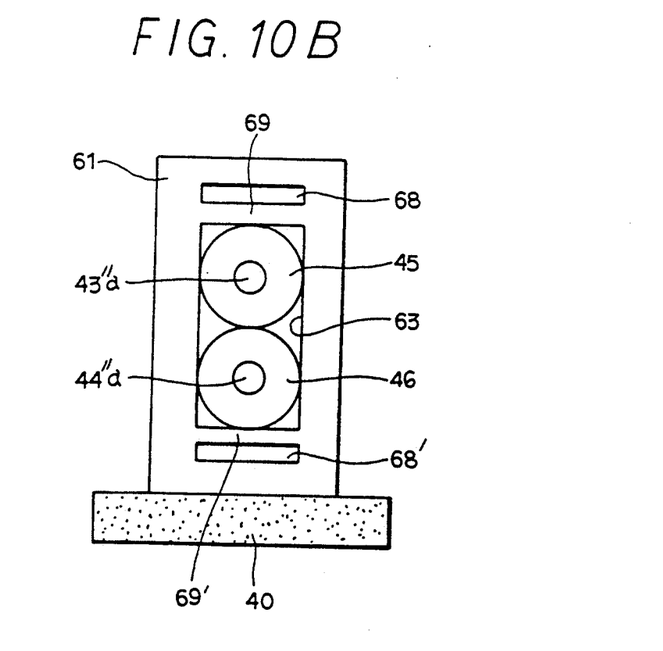
Figure 11:
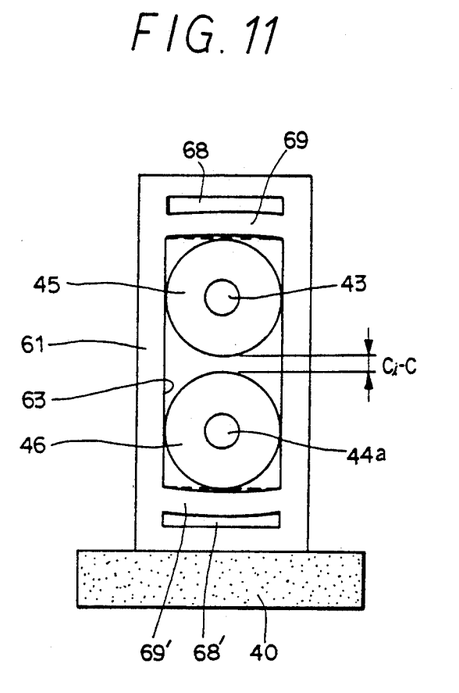
FIG. 11 is a side view showing the displacement of an elastic rib member provided to the developing apparatus of FIGS. 10A and 10B.
Figure 12A:
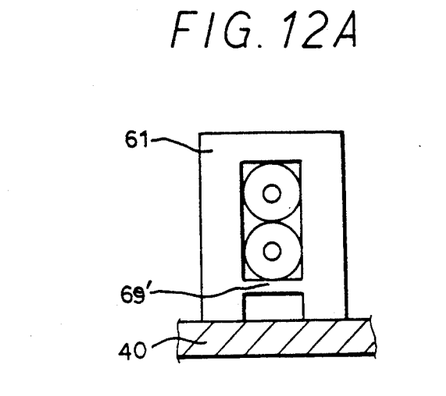
FIGS. 12A to 12C are side views showing other embodiments of the elastic rib member of the developing apparatus of FIGS. 10A and 10B, respectively.
Figure 12B:
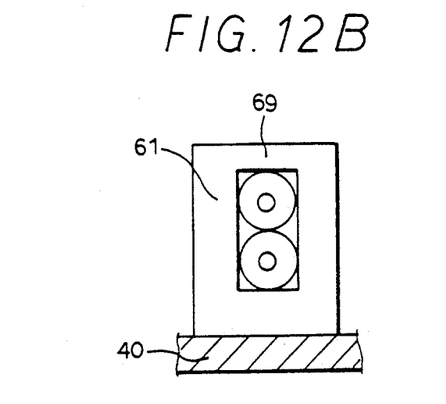
Figure 12C:
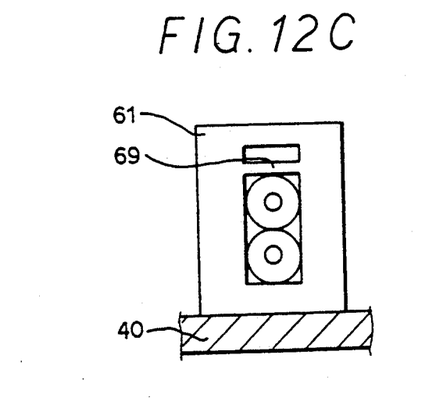

Turning now to FIGS. 10 to 12 which each shows still another embodiment of the developing apparatus in accordance with this invention, this developing apparatus comprises a pair of side plates 61 mounted on the printer base 40, respectively, and cylindrical upper and lower pressing rollers 43" and 44" each supported between said side plates 61. The side plates 61 are spaced apart from each other and each provided with a rectangular mounting hole 63 formed at a center portion thereof. The upper and lower pressing rollers 43" and 44" form the predetermined clearance "C" therebetween and each provided with the support bearings 45, 46 at its both end shafts 43"a, 44"a. The support bearings 45 and 46 are vertically disposed in the respective mounting holes 63 of the side plates 61 for supporting the upper and lower pressing rollers 43" and 44".

As shown in FIG. 10A, the upper and lower pressing rollers 43" and 44" of the developing apparatus each has the cylindrical shape having a diameter $D_1$ but has no flanges 43c, 43'c and 44'c. On the other hand, the bearings 45 and 46 each has a diameter $D_2$, said diameter $D_2$ is larger than the diameter $D_1$ so that there is provided the clearance "C" between the upper and lower pressing rollers 43" and 44". The clearance "C" has the equivalent value with the result value of $D_2-D_1$, that is $C=D_2-D_1$. Also, each side plate 61 is provided with upper and lower lateral slender openings 68 and 68' each formed as spaced apart from the position of the support bearings 45, 46, thereby providing slender elastic ribs 69, 69' between each of said slender openings 68, 68' and each of said support bearings 45, 46. Each of the ribs 69, 69' is capable of being elastically bent and functioning as the pressure controlling member for the upper and lower pressing rollers 43" and 44".

As above described, the clearance "C" provided between the upper and lower pressing rollers 43" and 44" is set as being less than the maximum coloring thickness $C_i$ of the cycolor paper "P", that is $C \leq C_i$. Thus, the upper and lower pressing rollers 43" and 44" have to displace upwardly and downwardly in order to provide an additional clearance of $C_i-C$ therebetween as the maximum coloring thickness portions of the cycolor paper "P" pass between the upper and lower pressing rollers 43" and 44", as shown in FIG. 11. Accordingly, the respective upper and lower elastic ribs 69 and 69' of the side plates 61 each is designed as being bent in the deflection amount of $C_i-C$ during the developing operation. Hence, each rib 69, 69' is formed as having the elastic region capable of withstanding the deflection amount of $C_i-C$ in order to prevent the plastic deformation of said ribs 69 and 69' which may be caused by the deflection of $C_i-C$.

Each side plate 61 of the developing apparatus shown in FIGS. 10 and 11 is provided with respective upper and lower elastic ribs 69 and 69', spaced apart from each other, as the pressure controlling member for the upper and lower pressing rollers 43" and 44". However, the elastic rib may comprise another type of rib capable of providing the enough deflection amount of $C_i-C$ within the scope of the present invention, such as it may simply comprise only the lower elastic rib 69' provided at a lower portion of each side plate 61 as shown in FIG. 12A, or the upper periphery of each side plate 61 as the upper elastic rib 69 having the elasticity provided by forming the rectangular mounting hole 63 near the upper end of each said side plate 61 as shown in FIG. 12B, or only the upper elastic rib 69 provided at an upper portion of each side plate 61 by forming the upper lateral slender opening as shown in FIG. 12C.

The third embodiment of the developing apparatus provides an advantage in that it removes the pressure controlling bolts, which are necessary in the first and second embodiments, because the upward and downward pressure subjected to the upper and lower pressing rollers 43" and 44" during the developing operation can be absorbed by the elastic ribs 69 and 69' each provided as forming the lateral slender openings 68 and 68' at each side plate 61.

As above described, the developing apparatus for the cycolor type color video printer in accordance with the present invention provides several advantages in that it prevents the deflection of the upper and lower pressing rollers by providing the predetermined clearance "C" between said upper and lower pressing rollers, thereby preventing the jamming of the cycolor paper simultaneously with improving the equality of the coloring. Also, the developing apparatus of this invention provides another advantages in that it prevents the frictional damage of the pressing rollers and does not need any auxiliary device for allowing the pressing rollers to have the desired clearance "C" because of the clearance "C" simply provided by the shape of the pressing rollers, thereby facilitating the installing work of the video printer and accomplishing the compactness of said video printer.

Although the preferred embodiments of the present invention have been disclosed for illustrative purpose, those skilled in the art will appreciate that various modifications, additions and substitutions are possible, without departing from the scope and spirit of the invention as disclosed in the accompanying claims.

What is claimed is:

1. A roller type developing apparatus for transcribing an exposed color image of a cylith film onto a receiver paper by means of pressing power provided thereby, comprising:
   a first roller, having a first pressing surface;
   a second roller, having a second pressing surface substantially parallel to said first roller;
   separating means, for providing a separation between the first and second pressing surfaces, whereby the first pressing surface does not touch the second pressing surface;
   means for applying an even pressure to cylith film and receiver paper passed between the first and second pressing surfaces, whereby the exposed image of the cylith film is put onto the receiver paper.

2. In a cycolor type color video printer including a roller type developing apparatus for transcribing an exposed color image of a cylith film onto a receiver paper by means of pressing power provided thereby, said developing apparatus comprising:
   a pair of side plates mounted on a base of said color video printer and spaced apart from each other, said side plates each provided with a mounting hole;
   rotary pressing means rotatably supported between said side plates, said rotary pressing means provided with a clearance for allowing said cylith film and said receiver paper to pass therethrough at the same time, and said rotary pressing means comprising an upper pressing roller provided with a pair of flanges, one at each end thereof, and a cylindrical lower pressing roller contacting with said flanges of the upper pressing roller at both ends thereof, thereby providing said clearance between said upper and lower pressing rollers;
   upper and lower support bearings vertically mounted in each said mounting hole of said side plate and connected to respective end shafts of said rotary pressing means, respectively, and each adapted for supporting said rotary pressing means rotatably; and
   a pressure controlling means for controlling said clearance in order to control the pressure for said rotary pressing means.

3. A roller type developing apparatus for a cycolor type color video printer as claimed in claim 2, wherein said pressure controlling means comprises an elastic support roller rotatably supported between said side plates under said lower pressing roller in order to be spaced apart from said lower pressing roller, a support bearing rotatably mounted on a center portion of said support roller, and a pair of pressure controlling bolts each provided at an upper end of each of said side plates and contacting with said upper support bearing.

4. A roller type developing apparatus for a cycolor type color video printer as claimed in claim 3, said roller type developing apparatus further comprising a guide member mounted on said printer base and having a guide groove thereon, said guide member adapted for restraining the displacement of said support bearing of the support roller by means of said guide groove.

5. In a cycolor type color video printer including a roller type developing apparatus for transcribing an exposed color image of a cylith film onto a receiver paper by means of pressing power provided thereby, said developing apparatus comprising;
   a pair of side plates mounted on a base of said color video printer and spaced apart from each other, said side plates each provided with a mounting hole;
   rotary pressing means rotatably supported between said side plates, said rotary pressing means provided with a clearance for allowing said cylith film and said receiver paper to pass therethrough at the same time, and said rotary pressing means comprising upper and lower pressing rollers each provided with a pair of flanges one flange at each end thereof, thereby providing the clearance between said upper and lower pressing rollers;
   upper and lower support bearings vertically mounted in each said mounting hole of said side plate and connected to respective end shafts of said rotary pressing means, respectively, and each adapted for supporting said rotary pressing means rotatably; and
   a pressure controlling means for controlling said clearance in order to control the pressure for said rotary pressing means.

6. A roller type developing apparatus for a cycolor type color video printer as claimed in claim 5, wherein said pressure controlling means comprises a pair of pressure controlling bolts, one bolt respectively at the upper end of each of said side plates, and a pair of elastic cushions interposed between said upper and lower support bearings of the upper and lower pressing rollers, each said cushion adapted for biasing said upper and lower support bearings upwardly and downwardly.

7. In a cycolor type color video printer including a roller type developing apparatus for transcribing an exposed color image of a cylith film onto a receiver paper by means of pressing power provided thereby, said developing apparatus comprising:
   a pair of side plates mounted on a base of said color video printer and spaced apart from each other, said side plates each provided with a mounting hole;
   rotary pressing means rotatably supported between said side plates, said rotary pressing means provided with a clearance for allowing said cylith film and said receiver paper to pass therethrough at the same time;
   upper and lower support bearings vertically mounted in each said mounting hole of said side plate and connected to respective end shafts of said rotary pressing means, respectively, and each adapted for supporting said rotary pressing means rotatably, said upper and lower support bearings each having a diameter of $D_2$, and said rotary pressing means comprising cylindrical upper and lower pressing rollers each having a diameter of $D_1$, whereby said clearance has a value equal to $D_2-D_1$; and a pressure controlling means for controlling said clearance in order to control the pressure for said rotary pressing means.

8. A roller type developing apparatus for cycolor type color video printer as claimed in claim 7, wherein said pressure controlling means comprises upper and lower lateral slender openings formed respectively at upper and lower portions of each of said side plates, respectively, and upper and lower elastic ribs provided at upper and lower portions of each of said side plates, respectively, each said elastic rib formed between said lateral slender opening and said support bearing of the pressing roller, respectively.

9. In a cycolor type color video printer including a roller type developing apparatus for transcribing an exposed color image of a cylith film onto a receiver paper by means of pressing power provided thereby, said developing apparatus comprising:

a pair of side plates mounted on a base of said color video printer and spaced apart from each other, said side plates each provided with a mounting hole;

rotary pressing means rotatably supported between said side plates, said rotary pressing means provided with a clearance for allowing said cylith film and said receiver paper to pass therethrough at the same time, said clearance set relatively larger than the thickness of said cylith film;

upper and lower support bearings vertically mounted in each said mounting hole of said side plate and connected to respective end shafts of said rotary pressing means, respectively, and each adapted for supporting said rotary pressing means rotatably; and a pressure controlling means for controlling said clearance in order to control the pressure for said rotary pressing means.

10. In a cycolor type color video printer as claimed in claim 1, wherein said separating means comprises a first and a second flange, said first flange at the opposite end of the first roller from the second flange.

11. In a cycolor type color video printer including a roller type developing apparatus for transcribing under pressure an exposed color image of a cylith film onto a receiver paper, said developing apparatus comprising:

a pair of side plates mounted on a base of said color video printer and spaced apart from each other, first and second pairs of supports, one pair for each of said side plates, each support including first and second support bearings mounted in each of said side plates, rotary pressing means rotatably supported by support bearings between said side plates, said rotary pressing means held by said support bearings with a clearance for allowing said cylith film and said receiver paper to pass therethrough at the same time under pressure, said rotary pressing means comprising a first pressing roller provided with a pair of flanges, one at each end thereof, and a cylindrical second pressing roller contacting with said flanges of the upper first pressing roller at both ends thereof, thereby providing said clearance between said first and lower second pressing rollers;

a pressure controlling means for controlling said clearance in order to control the pressure for said rotary pressing means.

12. A roller type developing apparatus for a cycolor type color video printer as claimed in claim 11, wherein said pressure controlling means comprises an elastic support roller rotatably supported between said side plates substantially parallel to and adjacent to said second pressing roller and spaced apart from said second pressing roller, a support bearing rotatably mounted on a center portion of said support roller, and a pair of pressure controlling bolts each provided at the first end of each of said side plates and contacting with said upper support bearing.

13. In a cycolor type color video printer including a roller type developing apparatus for transcribing under pressure an exposed color image of a cylith film onto a receiver paper, said developing apparatus comprising:

a pair of side plates mounted on a base of said color video printer and spaced apart from each other, first and second pairs of supports, one pair for each of said side plates, each support including first and second support bearings mounted in each of said side plates, rotary pressing means rotatably supported by support bearings between said side plates, said rotary pressing means held by said support bearings with a clearance for allowing said cylith film and said receiver paper to pass therethrough at the same time under pressure, and said rotary pressing means comprising first and second pressing rollers each provided with a pair of flanges, one flange at each end thereof, thereby providing the clearance between said first and second pressing rollers;

a pressure controlling means for controlling said clearance in order to control the pressure for said rotary pressing means.

14. In a cycolor type color video printer including a roller type developing apparatus for transcribing under pressure an exposed color image of a cylith film onto a receiver paper, said developing apparatus comprising:

a pair of side plates mounted on a base of said color video printer and spaced apart from each other, first and second pairs of supports, one pair for each of said side plates, each support including first and second support bearings mounted in each of said side plates, said first and second support bearings each having a diameter of $D_2$;

rotary pressing means rotatably supported by support bearings between said side plates, said rotary pressing means held by said support bearings with a clearance for allowing said cylith film and said receiver paper to pass therethrough at the same time under pressure; said rotary pressing means comprising cylindrical first and second pressing rollers each having a diameter of $D_1$, and said clearance having the value of the result of $D_2-D_1$;

a pressure controlling means for controlling said clearance in order to control the pressure for said rotary pressing means.

15. A roller type developing apparatus for a cycolor type color video printer as claimed in claim 14, wherein said pressure controlling means comprises first and second lateral slender openings formed at first and second end portions ends of each said side plate, respectively, and first and second elastic ribs provided at first and second end portions of each said side plate, respectively, each said elastic rib formed between each said lateral slender opening and each said support bearing of the pressing roller.

* * * * *